(12) United States Patent
Rendon et al.

(10) Patent No.: US 6,908,822 B2
(45) Date of Patent: Jun. 21, 2005

(54) SEMICONDUCTOR DEVICE HAVING AN INSULATING LAYER AND METHOD FOR FORMING

(75) Inventors: Michael J. Rendon, Austin, TX (US); John M. Grant, Austin, TX (US); Ross E. Noble, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 10/662,832

(22) Filed: Sep. 15, 2003

(65) Prior Publication Data

US 2005/0056899 A1 Mar. 17, 2005

(51) Int. Cl.[7] ............................................. H01L 29/02
(52) U.S. Cl. ..................... 438/303; 438/199; 438/230; 438/304; 438/305; 257/408
(58) Field of Search ........................... 257/408; 438/303, 438/304, 305, 199, 230

(56) References Cited

U.S. PATENT DOCUMENTS

| | | | |
|---|---|---|---|
| 5,766,969 A | 6/1998 | Fulford et al. | |
| 5,869,866 A | 2/1999 | Fulford et al. | |
| 5,895,955 A | 4/1999 | Gardner et al. | |
| 6,049,114 A | 4/2000 | Candelaria et al. | |
| 6,096,615 A | 8/2000 | Gardner et al. | |
| 6,104,063 A | 8/2000 | Fulford et al. | |
| 6,187,620 B1 | 2/2001 | Fulford et al. | |
| 6,429,083 B1 | 8/2002 | Ishida et al. | |
| 6,472,283 B1 | 10/2002 | Ishida et al. | |
| 2002/0151145 A1 * | 10/2002 | Lee et al. | 438/303 |
| 2002/0197806 A1 | 12/2002 | Furukawa et al. | |
| 2003/0042551 A1 | 3/2003 | Agnello et al. | |

OTHER PUBLICATIONS

Van Meer, Hans et al.; "70 nm Fully–Depleted SOI CMOS Using a New Fabrication Scheme: The Spacer/Replacer Scheme"; Symposium on VLSI Technology Digest of Technical Papers; 2002; 2 pp; IEEE.

* cited by examiner

Primary Examiner—Edward Wojciechowicz
(74) Attorney, Agent, or Firm—Joanne G. Chiu; Kim-Marie Vo (57) ABSTRACT

An insulating layer (24, 66, 82) is formed over a stack (14) of materials and a semiconductor substrate (12) and an implant is performed through the insulating layer into the semiconductor substrate. In one embodiment, spacers (26) are formed over the insulating layer (24), the insulating layer (24) is etched, and heavily doped regions (36) are formed adjacent the spacers. The spacers (26) are then removed and extension regions (50) and optional halo regions (46) are formed by implanting through the insulating layer (24). In one embodiment, the insulating layer (24) is in contact with the semiconductor substrate (12). In one embodiment, the stack (14) is a gate stack including a gate dielectric (18), a gate electrode (16), and an optional capping layer (22). The insulating layer (24, 66, 82) may include nitrogen, such as silicon nitride and aluminum nitride. In another embodiment, the insulating layer (24, 66, 82) may be hafnium oxide.

28 Claims, 6 Drawing Sheets

SEMICONDUCTOR DEVICE HAVING AN INSULATING LAYER AND METHOD FOR FORMING

FIELD OF THE INVENTION

The present invention relates generally to semiconductor devices, and more specifically, semiconductor devices having an insulating layer.

RELATED ART

As technology advances, semiconductor device geometries are becoming increasingly small, which results in significantly smaller process margins. For example, the implants used to define the junctions of a conventional transistor are becoming so shallow that small variations in the surface conditions during the implants negatively affect device performance. Currently, transistors are fabricated by forming a gate electrode, implanting shallow source/drain extension regions, forming sidewall spacers on either side of the gate electrode, and implanting deep source/drain regions. Prior to the implantation of the shallow source/drain extension regions, a native oxide (e.g. silicon dioxide) typically forms on the exposed silicon surfaces. The energies used for the shallow source/drain implants are becoming so low that small variations in the thickness of this native oxide negatively affect the profiles of the implanted species. This variation can result in increased off-state device leakage and other negative characteristics. Therefore, a need exists for a semiconductor device and a process for forming a semiconductor device having improved processing margins for forming the device junctions.

BRIEF DESCRIPTION OF THE DRAWINGS

The present invention is illustrated by way of example and not limited by the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION OF THE DRAWINGS

In order to provide a more controllable and reproducible surface, a liner or liner layer may be used. The liner or liner layer, which may be adjacent a gate stack and in physical contact with a semiconductor substrate surface, may provide a more controllable surface through which to perform implants as compared to a native oxide which may be present at the semiconductor substrate surface when a liner or liner layer is not present. The ability to provide improved implants may therefore allow for improved processing margins in forming the device junctions.

Figure 1:
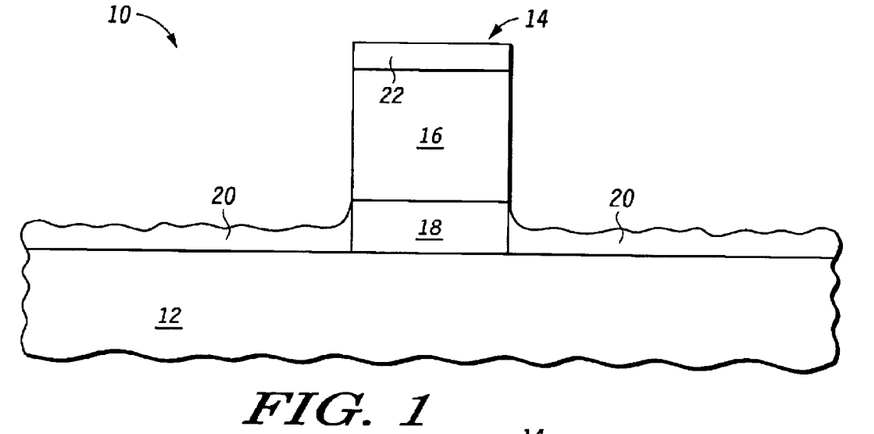
FIG. 1 illustrates a semiconductor device in accordance with one embodiment of the present invention.

FIG. 1 illustrates a semiconductor device 10 in accordance with one embodiment of the present invention. Semiconductor device 10 includes a substrate 12. Substrate 12 may be a silicon substrate, such as, for example, a bulk silicon substrate, or any other type of semiconductor substrate, such as, for example, a silicon-germanium substrate, a germanium substrate, gallium arsenide substrate, etc. Substrate 12 may also be a silicon-on-insulator (SOI) substrate or any other type of semiconductor on insulator substrate such as a silicon-germanium on insulator substrate.

Semiconductor 10 also includes a gate stack 14 formed over substrate 12. In the illustrated embodiment, gate stack 14 includes a gate dielectric 18 overlying substrate 12, a gate electrode 16 overlying gate dielectric 18, and a capping layer 22 overlying gate electrode 16. In one embodiment, gate dielectric 18 includes silicon dioxide. However, in alternate embodiments, gate dielectric 18 may include silicon oxynitride or a metal oxide, such as, for example, hafnium oxide, aluminum oxide, yttrium oxide, etc. Alternatively, gate dielectric 18 may include other high K (high dielectric constant) materials. In one embodiment, gate electrode 16 includes a polysilicon gate electrode. However, in alternate embodiments, gate electrode 16 may include a metal gate electrode, such as, for example, aluminum, tantalum, tungsten, etc. In one embodiment, capping layer 22 is an anti-reflective coating (ARC) layer, such as a silicon-rich nitride layer. In one embodiment, capping layer 22 may be a carbon-containing organic ARC layer. In one embodiment, capping layer 22 may be formed of multiple layers. Alternatively, capping layer 22 may be formed of any other materials or combination of materials used, for example, to protect gate electrode 16 during subsequent processing. In yet another embodiment, capping layer 22 may not be present.

Note that in alternate embodiments, gate stack 14 may be any type of gate stack, and is not limited to the embodiment illustrated in FIG. 1. For example, gate stack 14 may be any type of polysilicon or metal gate stack or may be a non-volatile memory gate stack, such as, for example, a floating gate stack, a discrete storage gate stack (for example, a quantum dots gate stack), or a silicon-oxide-nitride-oxide-silicon (SONOS) stack. Therefore, gate stack 14 may include more, fewer, or different layers than those illustrated in FIG. 1. Also note that gate stack 14 may be formed using conventional patterning and etch processes known in the art. In yet an alternate embodiment, gate stack 14 may be any type of stack, and thus may also be referred to as stack 14.

In the illustrated embodiment of FIG. 1, semiconductor device 20 also includes a residual gate dielectric layer 20 overlying substrate 12. Residual gate dielectric layer 20 is formed when etching gate stack 14. That is, residual gate dielectric layer 20 corresponds to the portions of the dielectric layer overlying substrate 12 that were not removed during the gate etch process. In an alternate embodiment, residual gate dielectric layer 20 may not be present. That is, all of the dielectric layer (on either side of gate stack 14) used to form gate dielectric 18 may have been removed during the gate etch process.

Figure 2:
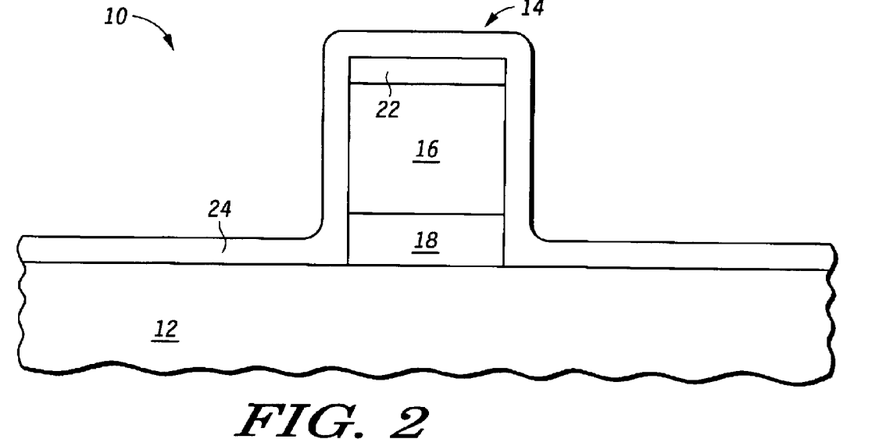
FIG. 2 illustrates the semiconductor device of FIG. 1 after formation of a liner layer, in accordance with one embodiment of the present invention.

FIG. 2 illustrates semiconductor device 10 after removal of residual gate dielectric layer 20 (if present) and formation of a liner layer 24. For example, if residual gate dielectric layer 20 is a silicon dioxide layer, it can be removed using conventional processes. Liner layer 24 is formed over substrate 12 and gate stack 14. In one embodiment, liner layer 24 is blanket deposited, such as by using atomic layer deposition (ALD). Alternatively, other deposition processes may be used such as chemical vapor deposition (CVD), plasma-enhanced CVD, low pressure CVD, or physical vapor deposition (PVD). Note that in the illustrated embodiment, liner layer 24 is in direct physical contact with the sidewalls of gate stack 14 and the exposed portions of substrate 12 on either side of gate stack 14. Liner layer 24 may also be referred to as an insulating layer and may include silicon, oxygen, nitrogen, or any combination thereof. In one embodiment, line layer 24 is devoid of silicon dioxide. For example, liner layer 24 may be a silicon nitride liner layer. Alternatively, liner layer 24 may be formed of other dielectric materials, such as, for example, aluminum oxide, hafnium oxide, zirconium oxide, and lanthanum oxide. In one embodiment, liner layer 24 has a thickness in a range of approximately 5 Angstroms to 100 Angstroms, and more preferably, in a range of approximately 10 Angstroms to 30 Angstroms.

Figure 3:
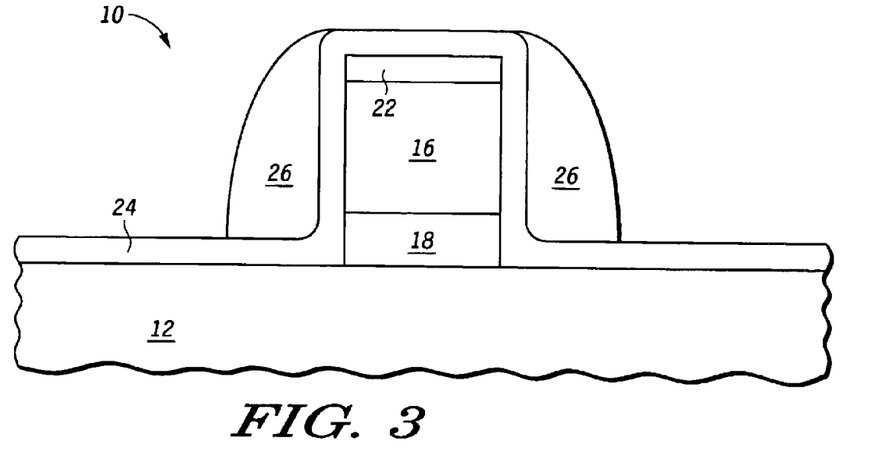
FIG. 3 illustrates the semiconductor device of FIG. 2 after formation of sidewall spacers, in accordance with one embodiment of the present invention.

FIG. 3 illustrates semiconductor device 10 after formation of sidewall spacers 26. In one embodiment (such as, for example, where liner layer 24 is a silicon nitride liner layer), sidewall spacers 26 may be formed by blanket depositing an oxide layer over silicon nitride liner layer 24 and etching the oxide layer to form sidewall spacers 26. In alternate embodiments, sidewall spacers 26 may include other materials, such as, for example, titanium nitride, silicon germanium, boron phosphorous silicate glass (BPSG), or any combination thereof. In one embodiment, the material or materials for sidewall spacers 26 are selected such that they have a high etch selectivity relative to liner layer 24. In this manner, sidewall spacers 26 may later be cleanly removed, if necessary.

Figure 4:
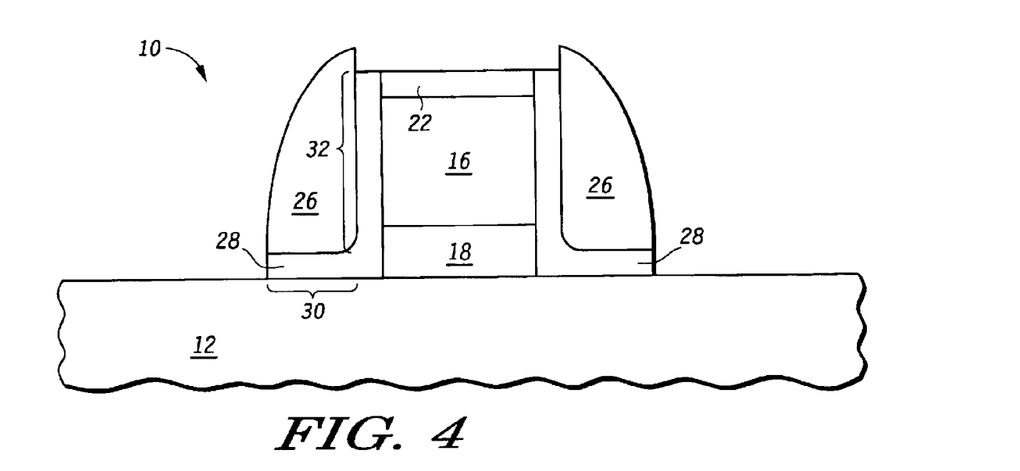
FIG. 4 illustrates the semiconductor device of FIG. 3 after formation of liners, in accordance with one embodiment of the present invention.

FIG. 4 illustrates semiconductor device 10 after etching of liner layer 24 to form liners 28. In the illustrated embodiment, portions of sidewall spacers 26 remain extending above gate stack 14. However, in alternate embodiments, portions of sidewall spacers 26 may also be removed during etch of liner layer 24. Note that conventional etch processes may be used to etch liner layer 24. For example, if liner layer 24 is a silicon nitride liner layer, hot phosphoric acid may be used to selectively etch liner layer 24. Note that liners 28 each include a sidewall portion (such as sidewall portion 32) adjacent and in physical contact with gate stack 14 and a foot portion (such as foot portion 30) adjacent and in physical contact with substrate 12.

Figure 5:
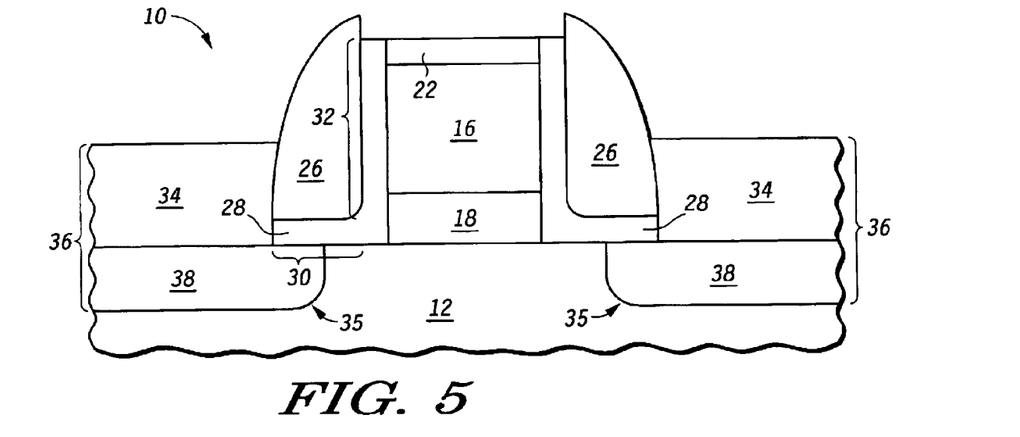
FIG. 5 illustrates the semiconductor device of FIG. 4 after formation of raised source/drain regions, in accordance with one embodiment of the present invention.

FIG. 5 illustrates semiconductor device 10 after formation of raised source/drain regions 36 (also referred to as heavily doped regions 36 or deep implant regions 36). Raised portions 34 are formed overlying substrate 12, on either side of sidewall spacers 26. In the illustrated embodiment, raised portions 34 are formed adjacent to sidewall spacers 26. In one embodiment, raised portions 34 are formed by selective deposition. In one embodiment, raised portions 34 include a semiconductor material, such as, for example silicon or silicon germanium. Alternatively, raised portions 34 may include other types of materials, such as, for example, titanium silicide, tungsten, and tungsten silicide. After formation of raised portions 34, a deep implant and anneal are performed to form source/drain regions 36. For example, raised source/drain regions 36 include implanted raised portions 34 and diffused implant regions 38 in substrate 12. In one embodiment, note that diffused implant regions 38 extend laterally below liners 28 (such as below foot portion 30). Note that a conventional deep implant and anneal may be used to form raised source/drain regions 36. Also note that, after implant, raised portions 34 may also be referred to as doped epitaxial region 34.

Note that the use of raised portions 34 to form raised source/drain regions 36 allow for a shallower implant into substrate 12. That is, in subsequent processing, portions of raised source/drain regions 36 are silicided to form silicide regions over source/drain regions 36 (not shown) which allow for better electrical contacts. However, in the formation of silicide regions, portions of the implanted semiconductor are consumed. Therefore, the use of raised portions 34 allow for the total implant depth of the heavily doped regions (e.g. raised source/drain regions 36) to remain sufficiently deep after silicidation while avoiding penetration of junctions 35 by the silicide and allowing for a shallower diffused implant region 38 into substrate 12.

In alternate embodiments, raised source/drain regions 36 may be formed differently. For example, in one embodiment, raised portions 34 may be doped regions. That is, they may be formed as raised doped regions prior to the deep implant. In this embodiment, raised portions 34 may also be referred to as doped epitaxial region 34. In yet another embodiment, source/drain regions may not be raised source/drain regions at all such that after formation of sidewall spacers 26, a deep implant and anneal may be performed to form deep implant regions within substrate 12 (such as region 38 without raised portion 34, where region 38 may extend deeper into substrate 12). In this embodiment, this deep implant region would correspond to the source/drain region or heavily doped region of semiconductor device 10.

Figure 6:
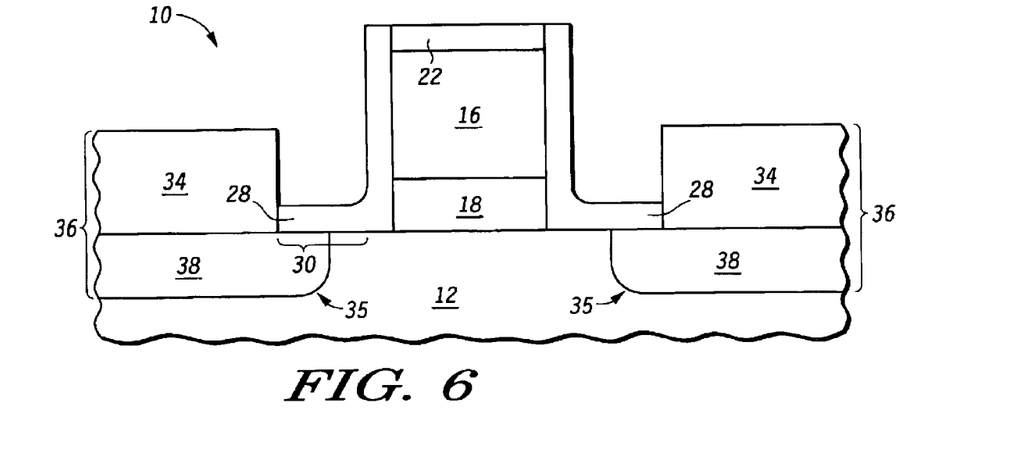
FIG. 6 illustrates the semiconductor device of FIG. 5 after removal of the sidewall spacers of FIG. 3, in accordance with one embodiment of the present invention.

FIG. 6 illustrates semiconductor device 10 after removal of sidewall spacers 26. In one embodiment, sidewall spacers 26 are removed by a selective wet etch, such as a hydrofluoric acid wet etch. Alternatively, other removal processes may be used. Note that in one example where liners 38 are silicon nitride liners (and devoid of silicon dioxide), the wet etch for removal of sidewall spacers 26 may not result in any undercutting of liners 28, and thus may not significantly affect the dimensions or surface of liners 28.

Figure 7:
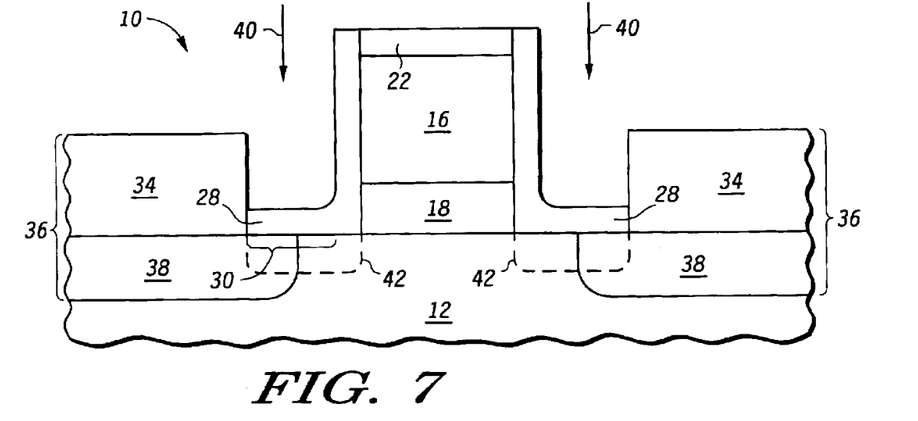
FIG. 7 illustrates the semiconductor device of FIG. 6 after a pre-amorphization implant to form amorphous regions, in accordance with one embodiment of the present invention.

FIG. 7 illustrates semiconductor device 10 after a pre-amorphization implant (PAI) 40 into substrate 12. In one embodiment, PAI 40 is implanted at approximately a 0 degree angle through the foot portions (such as foot portion 30) of liners 28 to form amorphous regions 42, as illustrated in FIG. 7. In one embodiment, the species of PAI 40 may be germanium, xenon, or silicon. Alternate embodiments may use other species. In one embodiment, a germanium species may be implanted at an energy in a range of approximately 8 to 12 keV and having a dose in a range of approximately $5 \times 10^{15}/cm^2$ to $6 \times 10^5/cm^2$. Note that in one embodiment of the present invention, the foot portions of liners 28 (such as foot portion 30) provides for a controlled and reproducible structure through which to implant to form amorphous regions 42. Therefore, note that the use of liners 28, such as silicon nitride liners, allows for a controlled, reproducible structure unlike the uncontrolled native oxide which would form without the presence of liners 28 (or at least the foot portions of liners 28).

Figure 8:
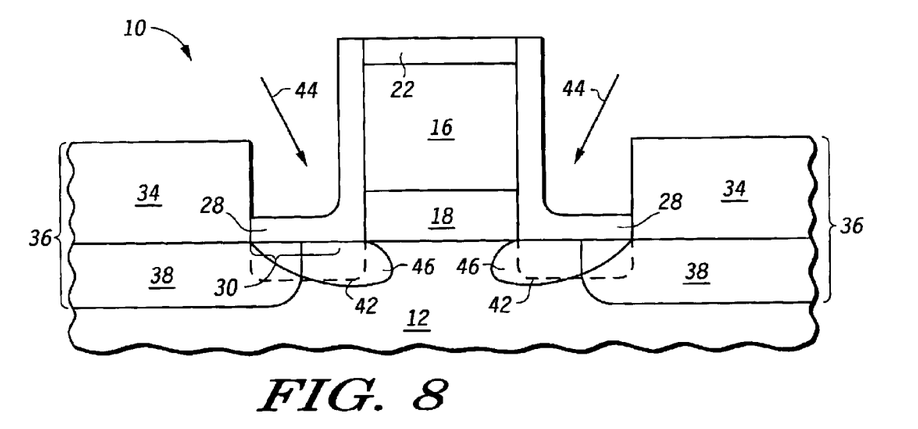
FIG. 8 illustrates the semiconductor device of FIG. 7 after a halo implant to form halo regions, in accordance with one embodiment of the present invention.

FIG. 8 illustrates semiconductor device 10 after a halo implant 44 (which may also be referred to as a pocket implant 44) into substrate 12 to form halo implant regions 46. In one embodiment, halo implant 44 is performed at approximately a 25 to 45 degree angle through the foot portions (such as foot portion 30) of liners 28 to form halo implant regions 46. In one embodiment, for an NMOS type device, the species of halo implant 44 may be boron, where the boron species may be implanted at an energy in a range of approximately 8 to 12 keV and having a dose in a range of approximately $1 \times 10^{13}/cm^2$ to $4 \times 10^{13}/cm^2$. In one embodiment, for a PMOS type device, the species of halo implant 44 may be arsenic, phosphorous, or antimony. For example, if arsenic is used as a species, it may be implanted at an energy in a range of approximately 30 to 50 keV and having a dose in a range of approximately $2 \times 10^{13}/cm^2$ to $5 \times 10^{13}/cm^2$. Note that in one embodiment of the present invention, the foot portions of liners 28 (such as foot portion 30) provides for a controlled and reproducible structure through which to implant to form halo regions 46. Therefore, note that the use of liners 28, such as silicon nitride liners, allows for a controlled, reproducible structure unlike the uncontrolled native oxide which would form without the presence of liners 28 (or at least the foot portions of liners 28).

Figure 9:
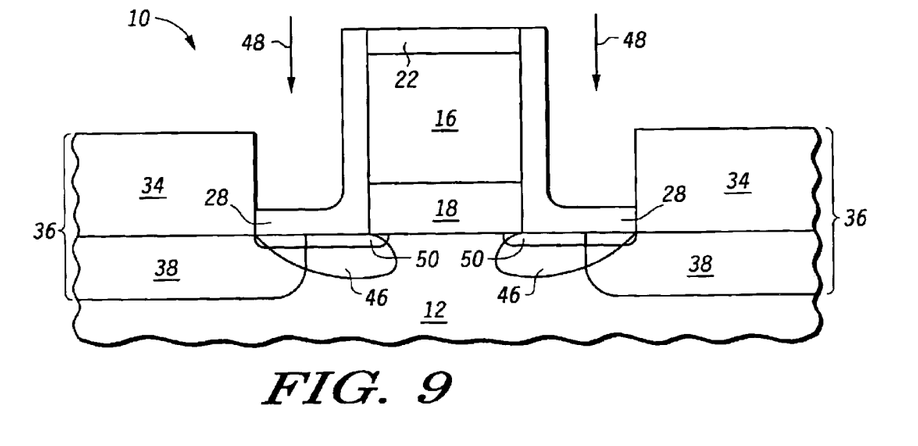
FIG. 9 illustrates the semiconductor device of FIG. 8 after a shallow implant to form extension regions, in accordance with one embodiment of the present invention.

FIG. 9 illustrates semiconductor device 10 after a shallow implant 48 and an anneal to form extension regions 50 underlying the foot portions of liners 28 and extending under gate dielectric 18. In one embodiment, shallow implant 48 is performed at approximately a 0 degree angle through the foot portions (such as foot portion 30) of liners 28. In one embodiment, the species of shallow implant 48 may be boron, phosphorous, arsenic, or antimony. Alternate embodiments may use other species. In one embodiment, in a PMOS device, a boron species may be implanted at an energy in a range of approximately 200 to 700 eV and having a dose in a range of approximately $5 \times 10^{14}/cm^2$ to $2 \times 10^{15}/cm^2$. In one embodiment, in an NMOS device, an arsenic species may be implanted at an energy in a range of approximately 1 to 5 keV and having a dose in a range of approximately $5 \times 10^{14}/cm^2$ to $3 \times 10^{15}/cm^2$. Note that in one embodiment of the present invention, the foot portions of liners 28 (such as foot portion 30) provides for a controlled and reproducible structure through which to implant to form extension regions 50. Therefore, note that the use of liners 28, such as silicon nitride liners, allows for a controlled, reproducible structure unlike the uncontrolled native oxide which would form without the presence of liners 28 (or at least the foot portions of liners 28). Furthermore, note that in one embodiment, the ability to control the depth and doping density of extension regions 50 into substrate 12 allows for improved device performance. Therefore, the use of liners 28 (e.g. the foot portions of liners 28) may provide a controllable and reproducible structure through which to perform the shallow implants in order to achieve a more controlled depth and doping density for extension regions 50.

Note that in alternate embodiments, either or both of PAI implant 40 of FIG. 7 and halo implant 44 of FIG. 8 may be optional. It can now be appreciated how the foot portions of liners 28 may provide for a controllable and reproducible surface which may therefore allow for improved implants such as implants 40, 44, and 48. These improved implants may therefore allow for improved implant regions (such as implant regions 42, 46, and 50) and provide improved device junctions. The ability to provide improved device junctions may widen process margins of the device junctions and thus improve device performance.

Figure 10:
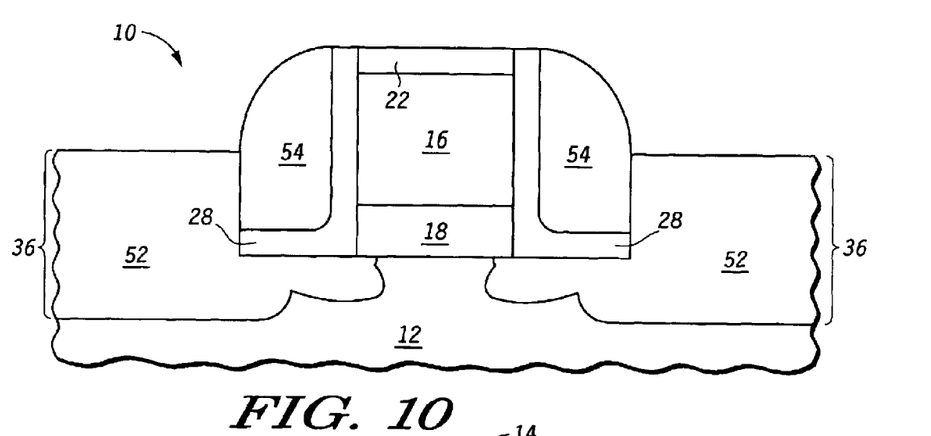
FIG. 10 illustrates the semiconductor device of FIG. 9 after formation of sidewall spacers, in accordance with one embodiment of the present invention.

FIG. 10 illustrates semiconductor device 10 after formation of sidewall spacers 54. Semiconductor device 10 includes current electrodes 52 (which includes source/drain regions 36, halo or pocket implant regions 46, if present, and extension regions 50). In one embodiment, sidewall spacers 54 are formed using conventional processes and may be formed of any type of insulating material, such as, for example, silicon dioxide. Note also that in one embodiment, capping layer 22 may also be removed prior to or during subsequent processing. Alternatively, capping layer 22 may not be formed during processing. Processing may then continue as known in the art to form a completed semiconductor device.

Figure 11:
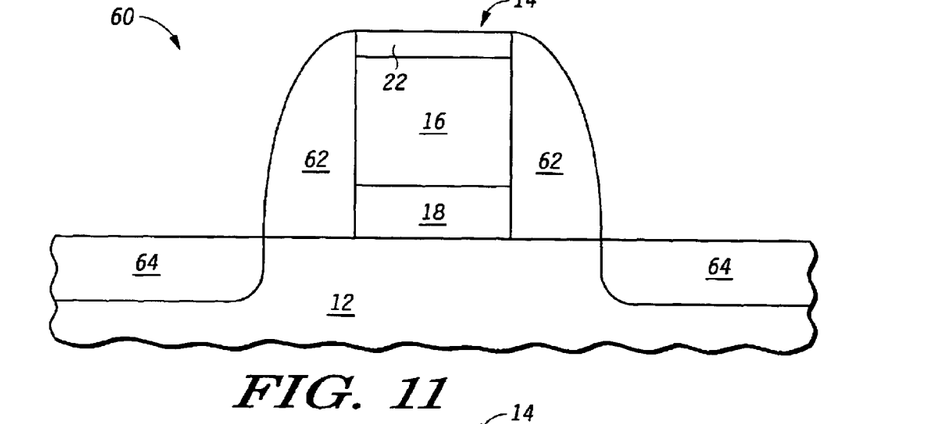
FIG. 11 illustrates the semiconductor device of FIG. 1 after formation of sidewall spacers and deep implant regions, in accordance with an alternate embodiment of the present invention.

FIGS. 11–14 illustrate processing of a semiconductor device 60 in accordance with an alternate embodiment of the present invention. FIG. 11 illustrates a semiconductor device 60 having a substrate 12, gate dielectric 18, gate electrode 16, and a capping layer 22, similar to semiconductor device 10 of FIG. 1. That is, the descriptions provided above for substrate 12, gate dielectric 18, gate electrode 16, and capping layer 22 also apply for semiconductor device 60. Note that residual gate dielectric layer 20 is not present in FIG. 11. If a residual gate dielectric layer 20 is present after gate etch (as illustrated in FIG. 1), then it is removed prior to further processing, as described above. Semiconductor device 60 of FIG. 11 includes sidewall spacers 62 on either side of gate stack 14 (formed after the removal of the residual gate dielectric layer, if present). Sidewall spacers 62 may be formed using conventional processes and materials. Note that in some embodiments, sidewall spacers may include multiple layers and materials. Semiconductor device 60 also includes deep implant regions 64 formed within substrate 12. Note that deep implant regions 64 may be formed using conventional processes such as implants. Note also that an anneal may be performed such that deep implant regions 64 may correspond to post-anneal deep implant regions.

Figure 12:
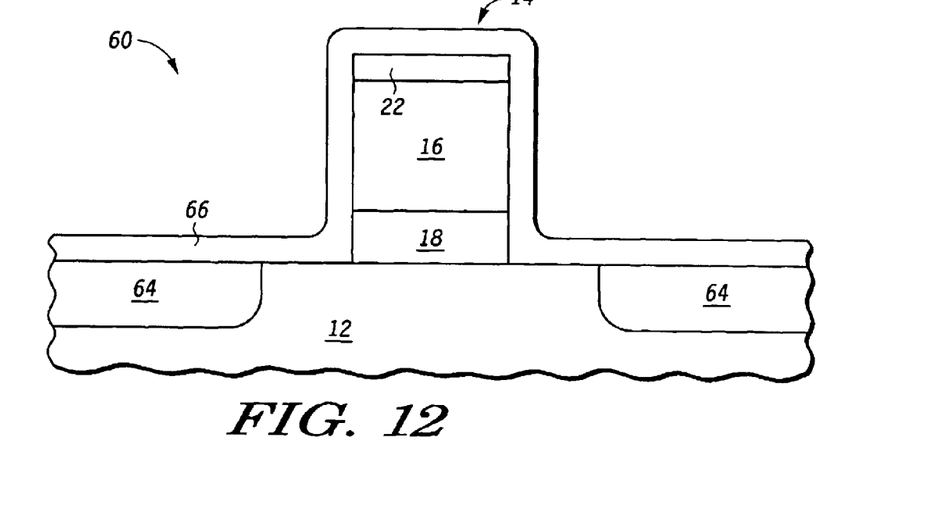
FIG. 12 illustrates the semiconductor device of FIG. 11 after formation of a liner layer, in accordance with one embodiment of the present invention.

FIG. 12 illustrates semiconductor device 60 after formation of a liner layer 66 overlying substrate 12 and gate stack 14. Note that the same descriptions provided above with respect to materials, processes, and thickness for liner layer 24 also apply here to liner layer 66. That is, liner layer 66 is analogous to liner layer 24 of FIG. 2 and may also be referred to as an insulating layer. However, note that unlike semiconductor device 10 of FIG. 2, semiconductor device 60 of FIG. 12 includes deep implant regions 64 underlying liner layer 66.

Figure 13:
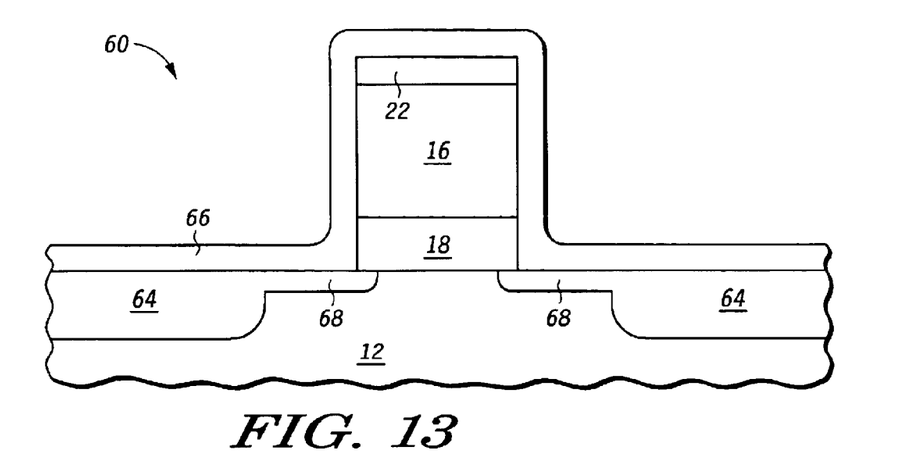
FIG. 13 illustrates the semiconductor device of FIG. 12 after formation of extension regions, in accordance with one embodiment of the present invention.

FIG. 13 illustrates semiconductor device 60 after formation of extension regions 68 in substrate 12. Note that the descriptions provided above with respect to implant 48 and extension regions 50 also apply here to extension regions 68 and the implant used to form regions 68. Note also that a PAI, a halo implant, or both, may also be performed (not shown) as was described above in reference to FIGS. 7 and 8. Note that in one embodiment, liner layer 66 provides a controllable and reproducible layer through which to form extension regions 68. That is, liner layer 66, such as, for example, a silicon nitride liner layer, allows for a controlled, reproducible structure unlike the uncontrolled native oxide which may be formed without the presence of liner layer 66.

Figure 14:
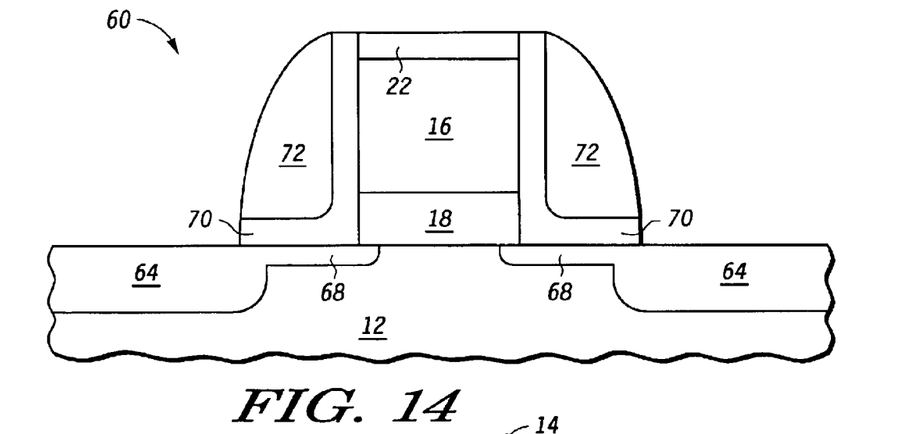
FIG. 14 illustrates the semiconductor device FIG. 13 after formation of sidewall spacers and liners.

FIG. 14 illustrates semiconductor device 60 after formation of sidewall spacers 72 and liners 70. In one embodiment, conventional deposition and etch processes may be used to form sidewall spacers 72 and liners 70. That is, for example, an insulating layer may be blanket deposited over liner layer 66 and etched to form sidewall spacers 72 (as was described above in reference to sidewall spacers 26 in FIG. 3) and liner layer 66 may then be etched to form liners 70 (as was described above in reference to liners 28 in FIG. 4). Note also that capping layer 22 may be removed. Alternatively, capping layer 22 may not be formed during processing. Processing may then continue as known in the art to form a completed semiconductor device.

Figure 15:
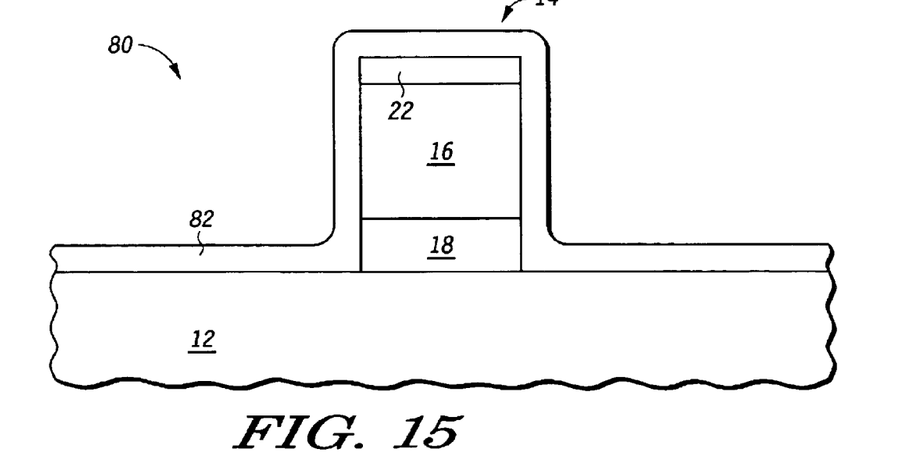
FIG. 15 illustrates the semiconductor device of FIG. 1 after formation of a liner layer in accordance with an alternate embodiment of the present invention.
Figure 16:
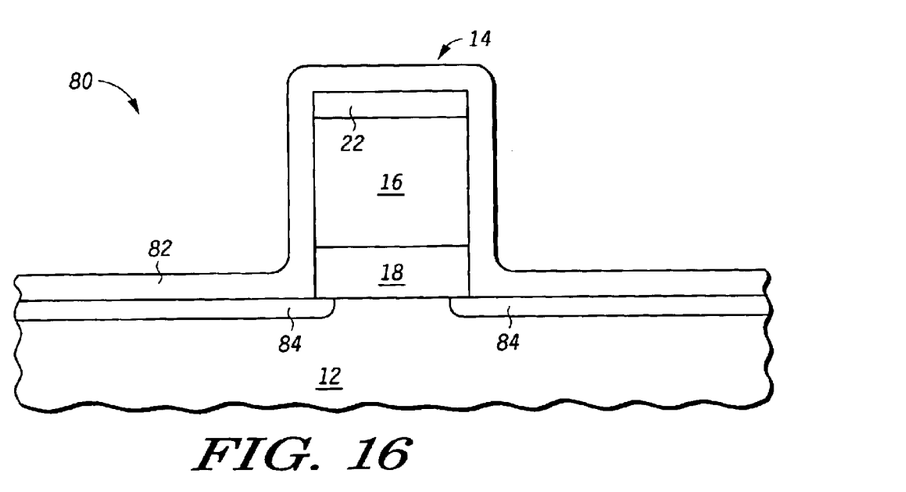
FIG. 16 illustrates the semiconductor device of FIG. 15 after formation of extension regions, in accordance with one embodiment of the present invention.
Figure 17:
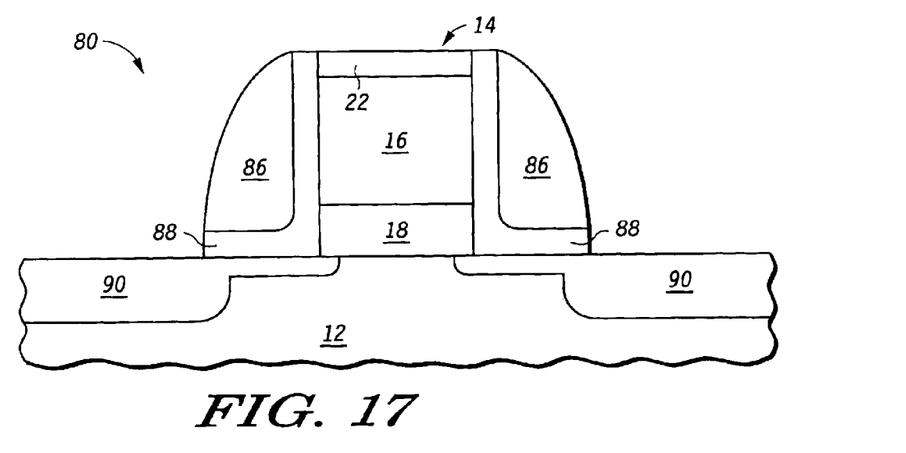
FIG. 17 illustrates the semiconductor device of FIG. 16 after formation of sidewall spacers, liners, and deep implant regions, in accordance with one embodiment of the present invention.

FIGS. 15–17 illustrate processing of a semiconductor device 80 in accordance with an alternate embodiment of the present invention. FIG. 15 illustrates a semiconductor device 80 having a substrate 12, gate dielectric 18, gate electrode 16, and a capping layer 22, similar to semiconductor device 10 of FIG. 2 (after removal of the residual gate dielectric layer 20, if present, and formation of liner layer 24). Semiconductor device 80 of FIG. 11 also includes a liner layer 82 formed over substrate 12 and gate stack 14. Note that the same descriptions provided above with respect to materials, processes, and thickness for liner layer 24 also apply here to liner layer 82. That is, liner layer 82 is analogous to liner layer 24 of FIG. 2, and may also be referred to as an insulating layer.

FIG. 16 illustrates semiconductor device 80 after formation of extension regions 84 in substrate 12. Note that the descriptions provided above with respect to implant 48 and extension regions 50 generally apply here to extension regions 84 and the implant used to form regions 84. Note also that a PAI, a halo implant, or both, may also be performed (not shown) as was described above in reference to FIGS. 7 and 8. Note that in one embodiment, liner layer 82 provides a controllable and reproducible layer through which to form extension regions 84. That is, liner layer 82, such as, for example, a silicon nitride liner layer, allows for a controlled, reproducible structure unlike the uncontrolled native oxide which may be formed without the presence of liner layer 82.

FIG. 17 illustrates semiconductor device 80 after formation of sidewall spacers 86, liners 88, and deep implant regions 90. In one embodiment, conventional deposition and etch processes may be used to form sidewall spacers 86 and liners 88. That is, for example, an insulating layer may be blanket deposited over liner layer 82 and etched to form sidewall spacers 86 (as was described above in reference to sidewall spacers 26 in FIG. 3) and liner layer 82 may then be etched to form liners 88 (as was described above in reference to liners 28 in FIG. 4). After formation of sidewall spacers 86 and liners 88, a deep implant may be performed, as known in the art, to form deep implant regions 90 adjacent to sidewall spacers 86. Note that in one embodiment, capping layer 22 may also be removed. Processing may then continue as known in the art to form a completed semiconductor device.

Note that some embodiments, raised source/drain regions 36, deep implant regions 64, and deep implant regions 90 may also be referred to as heavily doped regions 36, 64, and 90, respectively. In one embodiment, heavily doped refers to a region containing dopants at or above a concentration of $5 \times 10^{17}/cm^3$. Also, in one embodiment, extension regions 50, 68, and 84 may also be referred to as lightly doped regions 50, 68, and 84, respectively. However, in alternate embodiments, the extension regions are doped to levels that may be as high or higher in concentration than the highly doped regions. Also, note that each of amorphous regions 42, halo regions 46, and extensions regions 50, 68, and 84 may be referred to as implant regions. Similarly, each of raised source/drain regions 36, and deep implant regions 64 and 90 may also be referred to as implant regions.

Therefore, note that in the various embodiments described above in reference to FIGS. 1–17, a liner or liner layer (or insulating layer), such as, for example, a silicon nitride liner or liner layer, may be used to form a controllable surface through which to perform implants. For example, in the case of a silicon substrate, a native oxide may be formed during processing if no liners or liner layers are present. This native oxide can result in an uncontrollable surface, thus resulting in reduced processing margins. Therefore, it can be appreciated how a controllable surface such as liners 28 or liner layers 66 and 82 may provide improved processing margins in forming the device junctions by providing a controllable surface through which to perform implants. Furthermore, through the use of a liner layer devoid of silicon dioxide, undesirable oxidation of metal gate structures may be avoided. Oxidation of many of the materials that may be used as metal gate electrodes may severely impair device performance and can cause uncontrolled variations in transistor gate length or possibly even complete failure for very short channel devices.

In the foregoing specification, the invention has been described with reference to specific embodiments. However, one of ordinary skill in the art appreciates that various modifications and changes can be made without departing from the scope of the present invention as set forth in the claims below. Note also that the embodiments herein can apply to either NMOS or PMOS devices. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method for forming a semiconductor device the method comprising:
   providing a semiconductor substrate;
   forming a stuck over the semiconductor substrate;
   forming an insulating layer over the stack;
   forming a spacer over the insulating layer;
   forming a heavily doped region adjacent the spacer;
   removing first spacer after forming the heavily doped region; and
   after removing the spacer, implanting through the insulating layer and into the semiconductor substrate to form an extension region, wherein the heavily doped region and extension region are part of a current electrode.

2. The method of claim 1, wherein forming the insulating layer further comprises forming an insulating layer comprising nitrogen.

3. The method of claim 1, wherein forming the insulating layer further comprises forming a layer comprising silicon and nitrogen.

4. The method of claim 1, wherein forming the insulating layer further comprises forming a layer devoid of silicon dioxide.

5. The method of claim 1, wherein providing the semiconductor substrate further comprises providing a semiconductor substrate comprising silicon.

6. The method of claim 1, wherein forming the stack further comprises:
   forming a dielectric over the semiconductor substrate; and
   forming a gate electrode over the gate dielectric.

7. The method of claim 6, wherein forming the stack further comprises forming a capping layer over the gate electrode.

8. The method of claim 7, further comprising removing the capping layer after implanting.

9. The method of claim 1, wherein forming the insulating layer over the stack further comprises forming the insulating layer in contact with the semiconductor substrate.

10. The method of claim 9, wherein forming the insulating layer in contact with the semiconductor substrate further comprises forming a nitride layer in contact with the semiconductor substrate.

11. A method for forming a semiconductor device, the method comprising:
    providing a semiconductor substrate;
    forming a stack over the semiconductor substrate;
    forming a first spacer over the insulating layer;
    implanting into the semiconductor substrate to form a heavily doped region adjacent the first spacer;
    removing the first spacer after forming the heavily doped region;
    forming an insulating layer over the stack after removing the first spacer;
    implanting through the insulating layer and into the semiconductor substrate to form an extension region, wherein the heavily doped region and extension region are part of a current electrode; and
    forming a second spacer over the insulating layer.

12. The method of claim 1, wherein forming the heavily doped region adjacent the spacer further comprises forming a doped epitaxial region.

13. A method of forming a semiconductor device comprising:
    providing a semiconductor substrate;
    forming a stack over the semiconductor substrate;
    forming an insulating layer over the stack and the semiconductor substrate;
    implanting through the insulating layer and into the semiconductor substrate to form an extension region;
    forming a first spacer over the semiconductor substrate; and
    forming a heavily doped region adjacent the first spacer.

14. The method of claim 13, wherein forming the insulating layer further comprises forming a layer devoid of silicon dioxide.

15. The method of claim 13, wherein forming the first spacer is performed after forming the insulating layer.

16. The method of claim 15, comprising: removing the first spacer before implanting through the insulating layer; and forming a second spacer after implanting through the insulating layer; wherein forming the heavily doped region is performed before removing the first spacer.

17. The method of claim 13, wherein forming the first spacer is performed before forming the insulating layer.

18. The method of claim 17, further comprising:
    removing the first spacer before forming the insulating layer; and
    forming a second spacer after implanting; and wherein forming the heavily doped region is performed before forming the insulating layer.

19. The method of claim 13, wherein forming the insulating layer further comprises forming an insulating layer comprising nitrogen.

20. The method of claim 13, wherein forming the insulating layer further comprises forming a silicon nitride layer.

21. The method of claim 13, wherein providing the semiconductor substrate further comprises providing a semiconductor substrate comprising silicon.

22. The method of claim 13, wherein forming a stack further comprises:
    forming a gate dielectric over the semiconductor substrate; and
    forming a gate electrode over the gate dielectric.

23. The method of claim 18, wherein forming the stack further comprises forming a capping layer over the gate electrode.

24. The method of claim 23, further comprising removing the capping layer after implanting.

25. The method of claim 13, wherein forming the insulating layer over the stack further comprises forming the insulating layer in contact with the semiconductor substrate.

26. The method of claim 13, wherein forming the insulating layer in contact with the semiconductor substrate further comprises forming a nitride layer in contact with the semiconductor substrate.

27. A method of forming a semiconductor device, the method comprising:
    providing a semiconductor substrate;
    forming a stack over the semiconductor substrate;
    forming an insulating layer over die stack and the semiconductor substrate;
    implanting an extension region through the insulating layer and into the semiconductor substrate;
    forming a spacer adjacent the stack and over the insulating layer;
    removing a portion of the insulating layer over the semiconductor substrate; and
    forming a heavily doped region within the semiconductor region and adjacent the spacer.

28. The method of claim 27, wherein forming the insulating layer further comprises forming a layer devoid of silicon dioxide.

* * * * *

UNITED STATES PATENT AND TRADEMARK OFFICE
CERTIFICATE OF CORRECTION

PATENT NO. : 6,908,822 B2  
APPLICATION NO. : 10/662832  
DATED : June 21, 2005  
INVENTOR(S) : Michael J. Rendon Page 1 of 1

It is certified that error appears in the above-identified patent and that said Letters Patent is hereby corrected as shown below:

Column 10, Line 11, Claim No. 15:

Insert a carriage return after "comprising:"

Column 10, Line 53, Claim No. 27:

Delete "die" and replace with --the--

Signed and Sealed this

Fourteenth Day of November, 2006

JON W. DUDAS  
*Director of the United States Patent and Trademark Office*